United States Patent
Zhou et al.

(10) Patent No.: US 9,085,651 B2
(45) Date of Patent: Jul. 21, 2015

(54) HYBRID SILICONE COMPOSITION FOR LIGHT EMITTING DEVICE

(71) Applicants: HENKEL AG & CO. KGAA, Duesseldorf (DE); ABLESTIK (SHANGHAI) LTD., Shanghai (CN)

(72) Inventors: Jing Zhou, Shanghai (CN); Stijn Gillissen, Hasselt (BE); Karen Leyssens, Berchem (BE); Thomas Plantenberg, Leverkusen (DE); Ralf Dunekake, Duesseldorf (DE); Leticia Borque, Deusseldorf (DE)

(73) Assignees: ABLESTIK (SHANGHAI) LTD., Shanghai (CN); Henkel AG & CO. KGAA, Duesseldorf (DE)

( * ) Notice: Subject to any disclaimer, the term of this patent is extended or adjusted under 35 U.S.C. 154(b) by 0 days.

(21) Appl. No.: 13/833,234

(22) Filed: Mar. 15, 2013

(65) Prior Publication Data

US 2013/0200426 A1    Aug. 8, 2013

Related U.S. Application Data

(63) Continuation of application No. PCT/CN2010/077863, filed on Oct. 19, 2010.

(51) Int. Cl.

| C08G 77/20 | (2006.01) |
|---|---|
| C08F 20/68 | (2006.01) |
| C08L 83/06 | (2006.01) |
| H01L 23/29 | (2006.01) |
| H01L 33/56 | (2010.01) |
| C08F 283/12 | (2006.01) |

(52) U.S. Cl.
CPC ............. *C08F 20/68* (2013.01); *C08F 283/124* (2013.01); *C08L 83/06* (2013.01); *H01L 23/296* (2013.01); *H01L 33/56* (2013.01); *C08G 77/20* (2013.01); *H01L 2924/0002* (2013.01)

(58) Field of Classification Search
CPC .......... C08G 77/20; C08F 20/68; H01L 33/56
USPC .......................................................... 526/279
See application file for complete search history.

(56) References Cited

U.S. PATENT DOCUMENTS

| 7,125,917 | B2 | 10/2006 | Starkey | |
|---|---|---|---|---|
| 7,915,362 | B2 | 3/2011 | Ozai | |
| 2005/0079301 | A1* | 4/2005 | Hartleben et al. | 428/34.1 |
| 2005/0123776 | A1 | 6/2005 | Yoshikawa | |
| 2009/0306307 | A1* | 12/2009 | Ahn et al. | 525/418 |
| 2010/0301377 | A1* | 12/2010 | Kato et al. | 257/100 |

FOREIGN PATENT DOCUMENTS

| EP | 1424363 | A1 | 6/2004 |
|---|---|---|---|
| WO | 2007149422 | A2 | 12/2007 |
| WO | 2008023537 | * | 2/2008 |
| WO | 2009085183 | A2 | 7/2009 |
| WO | 2010004932 | A1 | 1/2010 |

* cited by examiner

*Primary Examiner* — Kuo-Liang Peng
(74) *Attorney, Agent, or Firm* — James E. Piotrowski

(57) ABSTRACT

A silicon-based curable composition providing improved transparency, mechanical strength and resistance against heat and photo-degradation comprises at least one organopolysiloxane represented by the composition formula (1):

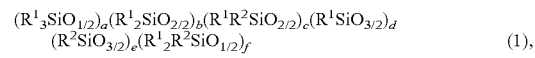

$$(R^1{}_3SiO_{1/2})_a(R^1{}_2SiO_{2/2})_b(R^1R^2SiO_{2/2})_c(R^1SiO_{3/2})_d(R^2SiO_{3/2})_e(R^1{}_2R^2SiO_{1/2})_f \quad (1),$$

wherein each $R^2$ independently represents a methacryloxyalkyl group having 5 to 20 carbon atoms and $a \geq 0$, $b \geq 0$, $c \geq 0$, $d \geq 0$, $e \geq 0$, $f \geq 0$, $c+e > 0$, and $a+b+c+d+e+f=1$; and at least one curing catalyst. The product is ideal for encapsulation of LED (light emitting device) elements.

11 Claims, No Drawings

HYBRID SILICONE COMPOSITION FOR LIGHT EMITTING DEVICE

FIELD OF THE INVENTION

This invention relates to the field of silicone compositions, as they are used e.g. for encapsulation of LEDs (light emitting devices). The invention especially relates to compositions based on hybrid silicones comprising structural units which carry (meth)acryl groups and allow for excellent discoloration resistance and good mechanical strength.

BACKGROUND OF THE INVENTION

LEDs have been widely used due to their remarkable advantages like high brightness, small size and high efficiency. Based on red or green LEDs, LEDs with high brightness are developed which emit light in blue/UV wave band. One example is white LEDs that produce visible white light combined with blue/UV light via fluorescent material. Consequently, the encapsulation material for LEDs needs to resist blue or UV light.

Epoxy resin-based compositions cured with acid anhydride are conventionally used as encapsulants for LEDs. U.S. Pat. No. 7,125,917 B2 discloses an epoxy composition with antioxidant and phosphor-containing compound that is used as LED encapsulant. Generally, despite excellent transparency of epoxy resins, they show disadvantageous photo-degradation under blue/UV light and resultant discoloration. Furthermore, the heat produced in high brightness LEDs will even deteriorate the discoloration and as a result it will hamper the light transmittance and consequently shorten the life span of LEDs.

As another encapsulant, silicone resin has been mainly used in high brightness LEDs due to its high light & heat-resistance. However, problems occurred insofar as silicone encapsulants are prone to deform and consequently increase the possibility of breakage of LEDs bonding wire. Therefore, improvement of mechanical properties is necessary. Furthermore, the low adhesiveness of silicone encapsulants might result in peeling between device and the seal during heat shock.

Hence, it is necessary to find a solution to balance the optical and mechanical properties of the encapsulant. Patent application US 20050123776 A1 discloses an epoxy-silicone hybrid composition and its cured product having improved properties of adhesiveness, heat and moisture resistance. However, disadvantages of low discoloration resistance in white LEDs can not be excluded.

Patent application CN 101148542 A discloses a hybrid acrylate-silicone composition to reach improved transparency and higher discoloration resistance under heat and blue/UV light.

Generally, there exists an ongoing demand for improvement of crosslinking behaviour and subsequently the integrated mechanical properties of silicone compositions for practical application in LEDs.

Thus, the object of the present invention is to provide a resin composition which exhibits excellent transparency and mechanical strength as well as high resistance against heat and photo-degradation.

SUMMARY OF THE INVENTION

The subject matter of the present invention is a curable composition which comprises (A) at least one organopolysiloxane represented by the composition formula (1):

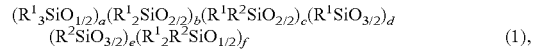

$(R^1{}_3SiO_{1/2})_a(R^1{}_2SiO_{2/2})_b(R^1R^2SiO_{2/2})_c(R^1SiO_{3/2})_d$
$(R^2SiO_{3/2})_e(R^1{}_2R^2SiO_{1/2})_f$     (1), wherein each $R^1$ independently represents a monovalent organic group having 1 to 20 carbon atoms or an OH group with the proviso that at each silicon-atom bearing no $R^2$ at least one $R^1$ represents a monovalent organic group having 1 to 20 carbon atoms, each $R^2$ independently represents a methacryloxyalkyl group having 5 to 20 carbon atoms and a, b, c, d, e, f each represent the fraction of the number of the respective units based on the number of all units of the organopolysiloxane and satisfy a≥0, b≥0, c≥0, d≥0, e≥0, f≥0 and also satisfy c+e>0 and a+b+c+d+e+f=1; and (B) at least one curing catalyst.

The aforementioned composition cures into a transparent product that exhibits excellent discoloration resistance as well as good mechanical strength. The product can advantageously be used in LED encapsulation, especially in blue or UV LEDs. Therefore, a further subject matter of the present invention is the use of a curable composition according to the present invention as encapsulant for LED (light emitting devices). Another subject matter of the invention is a LED (light emitting device) encapsulated by a cured product of a curable composition according to the present invention.

DETAILED DESCRIPTION OF THE INVENTION

A "curable composition" is understood to be a mixture of two or more substances, which mixture can be converted from a soft state into a harder state by means of physical or chemical actions. Those physical or chemical actions can consist, for example, in the delivery of energy in the form of heat, light, or other electromagnetic radiation, but also in simply bringing into contact with atmospheric moisture, water, or a reactive component. Preferably, the composition of the present invention is heat-curable. The curable composition comprises as component (A) at least one organopolysiloxane represented by a composition formula (1) shown below:

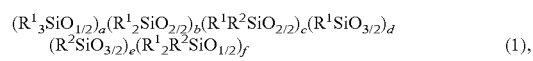

$(R^1{}_3SiO_{1/2})_a(R^1{}_2SiO_{2/2})_b(R^1R^2SiO_{2/2})_c(R^1SiO_{3/2})_d$
$(R^2SiO_{3/2})_e(R^1{}_2R^2SiO_{1/2})_f$     (1), wherein each $R^1$ independently represents a monovalent organic group having 1 to 20 carbon atoms or an OH group with the proviso that at each silicon-atom bearing no $R^2$ at least one $R^1$ represents a monovalent organic group having 1 to 20 carbon atoms, each $R^2$ independently represents a methacryloxyalkyl group having 5 to 20 carbon atoms and a, b, c, d, e, f each represent the fraction of the number of the respective units based on the number of all units of the organopolysiloxane and satisfy a≥0, b≥0, c≥0, d≥0, e≥0, f≥0 and also satisfy c+e>0 and a+b+c+d+e+f=1.

For a given organopolysiloxane the fraction of the number of the respective units based on the number of all units of the organopolysiloxane can be easily calculated by counting the number of a certain unit present in the organopolysiloxane and dividing this number by the number of all units present in the organopolysiloxane. For example, index a is calculated by dividing the number of $(R^1{}_3SiO_{1/2})$ units by the sum of $(R^1{}_3SiO_{1/2})$ units, $(R^1{}_2SiO_{2/2})$ units, $(R^1R^2SiO_{2/2})$ units, $(R^1SiO_{3/2})$ units, $(R^2SiO_{3/2})$ units and $(R^1{}_2R^2SiO_{1/2})$ units. Indices b, c, d, e and f are calculated accordingly.

An "organopolysiloxane" is understood to be a synthetic compound, in which silicon-atoms are linked via oxygen-atoms to form a chain or a three-dimensional network and wherein the remaining valencies at the silicon-atoms are saturated by organic groups or OH groups.

A "unit" within an organopolysiloxane is understood to be a structural motive which is formed of 1 silicon-atom and—according to the number of valencies at the silicon-atom—4 oxygen-atoms and organic groups, respectively, being directly bonded to the silicon-atom. In the context of the present invention, an organopolysiloxane is understood to exhibit at least ten units.

It is understood that $R^1$ and $R^2$ as well as further substituents at the Si-atoms, which will be introduced later herein, can be different not only within the various types of units of an organopolysiloxane (units having different indices a, b, c, d, e or f) but also within various units of one and the same type (units having the same index a, b, c, d, e or f) and even within one single unit. Thus, e.g. a $(R^1_3SiO_{1/2})$ unit may contain three different groups $R^1$.

In the composition formula (1), $R^1$ stands for a monovalent organic group having 1-20, preferably 1 to 8, carbon atoms, or $R^1$ stands for an OH group. However, if no $R^2$ is present in a unit, at least one $R^1$ of such unit stands for a monovalent organic group having 1-20 carbon atoms. The term "organic group" broadly encompasses hydrocarbon groups as such and hydrocarbon groups comprising one or more heteroatoms as substituent and/or as a member of the main chain, wherein the heteroatoms may be bonded directly to the silicon atom. Preferably, each $R^1$ independently represents a monovalent hydrocarbon group, an alkoxy group, a monovalent epoxide-containing group or an OH group. Specific examples of monovalent hydrocarbon groups are alkyl groups such as methyl, ethyl, n-propyl, i-propyl, n-butyl, i-butyl, n-hexyl, i-hexyl, n-octyl, i-octyl groups and vinyl groups. Among these, methyl groups and vinyl groups are more preferred and methyl groups are most preferred. Among the alkoxy groups, methoxy and ethoxy groups are preferred and methoxy groups are most preferred. Among the epoxide containing groups, glycidyloxyalkyl groups are preferred.

A "methacryloxyalkyl group" is understood to be a group of the structure $H_2C=C(Me)C(O)$—O-Alk with "Alk" being an alkylene group. Residues $R^2$ preferably comprise, as the alkylene group ("Alk") between the methacryloxy residue and the polymer-Si-atom, alkylene groups having 1-6 carbon atoms. Thus preferably, each $R^2$ in composition formula (1) independently represents a methacryloxyalkyl group having 5 to 10 carbon atoms. Among the aforementioned alkylene groups, methylene, ethylene, n-propylene, i-propylene, n-butylene and i-butylene groups are more preferred, and n-propylene groups are most preferred. Consequently, the most preferred methacryloxyalkyl group represented by $R^2$ in formula (1) is the (methacryloxy)n-propyl group.

In a first preferred embodiment of the invention, the organopolysiloxane is represented by the composition formula (8):

$$(R^{1'}_3SiO_{1/2})_a(R^{1'}_2SiO_{2/2})_b(R^{1'}R^2SiO_{2/2})_c(R^{1'}SiO_{3/2})_d(R^2SiO_{3/2})_e \quad (8),$$

wherein each $R^{1'}$ independently represents a monovalent unsubstituted or substituted hydrocarbon group having 1 to 20 carbon atoms, each $R^2$ independently represents a methacryloxyalkyl group having 5 to 20 carbon atoms and a, b, c, d, e each represent the fraction of the number of the respective units based on the number of all units of the organopolysiloxane and satisfy a≥0, b≥0, c≥0, d≥0, e≥0 and also satisfy c+e>0 and a+b+c+d+e=1.

In a further embodiment of the present invention, the organopolysiloxane is of linear structure represented by the composition formula (3):

$$(R^{1'}_3SiO_{1/2})_a(R^{1'}_2SiO_{2/2})_b(R^{1'}R^2SiO_{2/2})_c \quad (3),$$

wherein each $R^{1'}$ independently represents an unsubstituted or substituted monovalent hydrocarbon group having 1 to 20 carbon atoms, each $R^2$ independently represents a methacryloxyalkyl group having 5 to 20 carbon atoms and a, b, c represent the fraction of the number of the respective units based on the number of all units of the organopolysiloxane and satisfy a>0, b>0, c>0 and also satisfy a+b+c=1.

"Substituted" generally means in the context of the present invention that a hydrogen atom is replaced by another atom being different from hydrogen or by a functional group. A substituted hydrocarbon group may be e.g. a halogenated alkyl group. However, groups comprising any non-terminal heteroatom as one of the atoms constituting the main chain of the group are not regarded as substituted hydrocarbon groups. Preferably, each $R^{1'}$ represents an unsubstituted hydrocarbon group and most preferably a methyl group. $R^2$ is most preferably a (methacryloxy)n-propyl group. Specific examples of organopolysiloxanes according to formula (3) are:

$(CH_3)_3SiO((CH_3)_2SiO)_m(RCH_3SiO)_nSi(CH_3)_3$ and
$(CH_3)_3SiO(RCH_3SiO)_nSi(CH_3)_3$, wherein R represents a (methacryloxy)n-propyl group and m and n representing the number of the respective units mutually independently are integers from 2 to 300 and satisfy m+n≥10.

In a further embodiment, the at least one organopolysiloxane is of branched structure represented by the composition formula (4):

$$(R^{1'}_3SiO_{1/2})_a(R^{1'}_2SiO_{2/2})_b(R^{1'}R^2SiO_{2/2})_c(R^{1'}SiO_{3/2})_d(R^2SiO_{3/2})_e \quad (4),$$

wherein each $R^{1'}$ independently represents an unsubstituted or substituted monovalent hydrocarbon group having 1 to 20 carbon atoms, each $R^2$ independently represents a methacryloxyalkyl group having 5 to 20 carbon atoms and a, b, c, d, e each represent the fraction of the number of the respective units based on the number of all units of the organopolysiloxane and satisfy a>0, b≥0, c≥0, d≥0, e>0 and a+b+c+d+e=1. Preferably, each $R^{1'}$ represents an unsubstituted hydrocarbon group and most preferably a methyl group. Furthermore, $R^2$ preferably represents a (methacryloxy)n-propyl group. Specific examples of branched structured organopolysiloxanes according to formula (4) are:

$((CH_3)_3SiO_{1/2})_{2+q}((CH_3)_2SiO)_m(RSiO_{3/2})_q$ $((CH_3)_3SiO_{1/2})_{2+q+n}(CH_3SiO_{3/2})_n(RSiO_{3/2})_q$ $((CH_3)_3SiO_{1/2})_{2+q+n}((CH_3)_2SiO_{2/2})_m(CH_3SiO_{3/2})_n(RSiO_{3/2})_q$ $((CH_3)_3SiO_{1/2})_{2+q}((CH_3)_2SiO)_m(RCH_3SiO)_p(RSiO_{3/2})_q$ $((CH_3)_3SiO_{1/2})_{2+q+n}(CH_3SiO_{3/2})_n(RCH_3SiO)_p(RSiO_{3/2})_q$ $((CH_3)_3SiO_{1/2})_{2+q+n}((CH_3)_2SiO)_m(CH_3SiO_{3/2})_n(RCH_3SiO)_p(RSiO_{3/2})_q$, wherein R represents a (methacryloxy)n-propyl group and m, n, p, q representing the number of the respective units mutually independently are integers from 2 to 300 and satisfy m+n+p+≥10.

Generally, the linear structures contribute to higher flexibility, while branched structures result in higher hardness. Therefore, especially preferred is a curable composition according to the present invention wherein the curable composition comprises at least one organopolysiloxane of linear structure represented by the composition formula (3) as described hereinbefore and wherein the composition further comprises at least one organopolysiloxane which is of branched structure represented by the composition formula (4) as described hereinbefore. In such a composition the weight ratio of organopolysiloxanes represented by composition formula (3) to organopolysiloxanes represented by composition formula (4) preferably is from 1:5 to 3:1, more preferably from 1:3 to 2:1 and most preferably from 1:2 to 1:1. Compositions exhibiting these specific ratios show optimized mechanical properties.

The presence of T-units in the branched-structured organopolysiloxanes advantageously contributes to the improvement of hardness, mechanical strength and heat-resistance of the composition. A T-unit is understood to be a unit having three Si—O bonds and thus carrying only one organic substituent.

The curable composition of the present invention may further comprise at least one oligomeric siloxane of cyclic structure represented by the formula (5):

$$(R^{1'}{}_2SiO_{2/2})_m(R^{1'}R^2SiO_{2/2})_n \quad (5),$$

wherein each $R^{1'}$ independently represents an unsubstituted or substituted monovalent hydrocarbon group having 1 to 20 carbon atoms, each $R^2$ independently represents a methacryloxyalkyl group having 5 to 20 carbon atoms and m and n each represent the number of the respective units and m is an integer from 0 to 5, n is an integer from 1 to 5 and $3 \leq m+n \leq 9$. Preferably, each $R^{1'}$ represents an unsubstituted hydrocarbon group and most preferably a methyl group. Furthermore, $R^2$ preferably represents a (methacryloxy)n-propyl group.

In the context of the present invention, an "oligomeric siloxane" is understood to be a siloxane compound comprising between 3 and 9 units. Specific examples of oligomeric siloxanes according to formula (5) are:

$$((CH_3)_2SiO_{2/2})_m(RCH_3SiO_{2/2})_n,$$

wherein R represents a (methacryloxy)n-propyl group, m is an integer of 0 to 5, n is an integer of 1 to 5 and the sum of m+n is 3 to 5. More preferred are silicone compounds having the formula: $(RCH_3SiO_{2/2})_n$, wherein R is as defined above and n is an integer of 3 to 5.

In a further embodiment of the present invention, the organopolysiloxane is of branched structure represented by the composition formula (6):

$$(R^{1''}R^h{}_2SiO_{1/2})_a(R^{1''}R^hSiO_{2/2})_b(R^hR^2SiO_{2/2})_c$$
$$(R^{1''}SiO_{3/2})_d(R^2SiO_{3/2})_e(R^2R^h{}_2SiO_{1/2})_f \quad (6),$$

wherein each $R^{1''}$ independently represents an unsubstituted or substituted monovalent hydrocarbon group having 1 to 20 carbon atoms or an epoxide-containing monovalent group having 2 to 20 carbon atoms; each $R^h$ independently represents an alkoxy group having 1 to 8 carbon atoms or an OH group; each $R^2$ independently represents a methacryloxyalkyl group having 5 to 20 carbon atoms and a, b, c, d, e, f represent the fraction of the respective units based on the number of all units of the organopolysiloxane and satisfy $a \geq 0$, $b \geq 0$, $c \geq 0$, $d \geq 0$, $e > 0$, $f \geq 0$ and $a+b+c+d+e+f = 1$.

Preferably, the curable composition of this embodiment comprises at least one organopolysiloxane obtainable by reacting at least one silane represented by the formula (I):

$$(R^{h'}O)_3SiR^2 \quad (I),$$

wherein each $R^{h'}$ independently represents an alkyl group having 1 to 8 carbon atoms and $R^2$ represents a methacryloxyalkyl group having 5 to 20 carbon atoms, and at least one silane represented by the formula (II):

$$(R^{h'}O)_3SiR^{1'''} \quad (II),$$

wherein each $R^{h'}$ independently represents an alkyl group having 1 to 8 carbon atoms and $R^{1'''}$ represents a monovalent hydrocarbon group having 1 to 20 carbon atoms or an epoxide containing monovalent group having 2 to 20 carbon atoms, with water in such an amount that the molar amount of water at least equals the molar amount of all Si-atoms of the silanes represented by the formulas (I) and (II) and preferably the molar amount of water at least equals the 1.5-fold molar amount of all Si-atoms of the silanes represented by the formulas (I) and (II).

An "epoxide-containing group" is understood to be a group comprising a three-membered, oxygen-containing heterocycle. Preferably, the epoxide containing group is a glycidyloxyalkyl group. Thus, $R^{1'''}$ preferably represents a vinyl group or a glycidyloxyalkyl group.

According to a specific embodiment of the curable composition, the organopolysiloxane of the preceding embodiment is represented by the composition formula (7):

$$(R^hR^2SiO_{2/2})_c(R^2SiO_{3/2})_e(R^2R^h{}_2SiO_{1/2})_f \quad (7),$$

wherein each $R^h$ independently represents an alkoxy group having 1 to 8 carbon atoms or an OH group; $R^2$ represents a methacryloxyalkyl group having 5 to 20 carbon atoms c, e, f each represent the fraction of the number of the respective units based on the number of all units of the organopolysiloxane and satisfy $c \geq 0$, $e > 0$, $f \geq 0$ and $c+e+f = 1$. Preferably, e satisfies $0.5 \leq e$, more preferably $0.7 \leq e$ and most preferably $0.9 \leq e$. The organopolysiloxane represented by the composition formula (7) is in accordance with an organopolysiloxane obtainable by reacting a silane represented by the formula (I):

$$(R^{h'}O)_3SiR^2 \quad (I),$$

wherein each $R^{h'}$ independently represents an alkyl group having 1 to 8 carbon atoms and $R^2$ represents a methacryloxyalkyl group having 5 to 20 carbon atoms, with water in such an amount that the molar amount of water at least equals the molar amount of all Si-atoms of the silane represented by the formula (I) and preferably the molar amount of water at least equals the 1.5-fold molar amount of all Si-atoms of the silane represented by the formula (I).

When the silane according to formula (I) or the silanes according to formulas (I) and (II) are reacted with water, the reaction mixture may further comprise methanol and/or ethanol and a catalyst selected from hydroxides of alkaline and/or alkaline earth metals, butyl lithium and tin-organic compounds, e.g. dibutyl tin dilaurate. Throughout all embodiments of the present invention and hence in composition formulas (1), (3), (4), (5), (6), (7) and (8) as well as in formula (I), $R^2$ preferably represents a methacryloxy(n-propyl) group.

The amount of the sum of all organopolysiloxanes and oligomeric siloxanes in the curable composition of the present invention preferably is from 20 wt % to 80 wt % and more preferably from 30 wt % to 60 wt %, based on the total weight of the curable composition, respectively.

The curable composition according to the invention comprises as component (B) at least one curing catalyst. As the curing catalyst any compound may be used which in catalytic amounts is able to initiate or at least to enhance the curing of the inventive composition. Preferably, component (B) is at least one radical generating agent. More preferably, component (B) is at least one organic peroxide.

Preferably, the curing catalyst is selected from benzyl peroxide, t-butyl perbenzoate, o-methylbenzyl peroxide, di-t-butyl peroxide, dicumyl peroxide, 1,1-bis(t-butylperoxy)-3,3,5-trimethyl cyclohexane, 1,1-di(t-butylperoxy) cyclohexane, 2,5-dimethyl-2,5-di(t-butylperoxy)hexane, 2,5-dimethyl-2,5-di(t-butylperoxy)hexane, di(4-methylbenzoylperoxy)hexamethylene biscarbonate, 1,1-di-(tert-amyl peroxy)cyclohexane and mixtures thereof.

The content of the curing catalyst is preferably 0.01-5 wt % and more preferably 0.02-2 wt %, based on the total weight of the curable composition, respectively.

In a special embodiment of the present invention, the curable composition further comprises at least one methacrylate monomer represented by formula (2):

$$(H_2C=C(CH_3)COO)_z R^3 \quad (2),$$

wherein $R^3$ represents a z-valent substituted or unsubstituted hydrocarbon residue the main chain of which may comprise one or more oxygen atoms. Preferably, the group $R^3$ has 1-40 carbon atoms. More preferably, $R^3$ is selected from unsubstituted or substituted alkyl, cycloalkyl, alkenyl, cycloalkenyl, alkaryl, aralkyl and aryl groups having 1 to 20 carbon atoms.

Preferably, z is 1, 2 or 3 and more preferably 1 or 2.

The methacrylate monomer is e.g. selected from polyethylene glycol dimethacrylate, citronellyl methacrylate, hydroxypropyl methacrylate, hexanediol dimethacrylate, trimethylolpropanyl trimethacrylate, tetrahydrodicyclopentadienyl methacrylate, triethylene glycol dimethacrylate, isobornyl methacrylate, dicyclopentanyl methacrylate, cyclohexane dimethanol dimethacrylate, tricyclodecane dimethanol dimethacrylate and mixtures thereof. Among these, citronellyl methacrylate, isobornyl methacrylate, dicyclopentanyl methacrylate, cyclohexane dimethanol dimethacrylate and mixtures thereof are most preferred.

As mentioned, combinations of two or more of these methacrylates can also be used.

The content of methacrylate monomers is preferably 10-80 wt % of the total weight of the curable composition and more preferably 30-50 wt % of the total weight of the curable composition. However, curable compositions according to the present invention wherein the organopolysiloxane is represented by the composition formula (6) or (7) are preferably free of methacrylate monomers represented by formula (2). "Free of" in this context means that if the composition contains methacrylate monomers represented by formula (2) in an amount of up to 1 wt % based on the total weight of the composition, the composition is still regarded as being free of methacrylate monomers represented by formula (2). Such unintended contents may e.g. result from impurities of components or from residues of syntheses.

The weight ratio of the total amount of organopolysiloxanes to the total amount of methacrylate monomers in the curable composition of the present invention preferably is from 3:1 to 1:3.

Additionally to the components of the present invention which have been mentioned already, further components may be added to the curable composition of the present invention as required, provided they do not impair the objects and effects of the present invention. Thus, the curable composition of the present invention may comprise inhibitors, solvents, pigments, dyes, stabilizers, extenders, plasticizers, blowing agents, lubricants, antioxidants, adhesion promoters, light stabilizers, UV absorbers, antifoams, fragrances and fungicides as well as other adjuvants commonly used in the art.

Representative examples of these optional components include antioxidants and adhesion promoters as described below.

Examples of antioxidants that may be added in the composition of the present invention include phenol-based, phosphorus-based and sulfur-based antioxidants. Specific examples of these antioxidants are phenol-based antioxidants such as 2,6-di-t-butyl-p-cresol, butylated hydroxyanisole, 2,6-di-t-butyl-p-ethylphenol, tearyl-β-(3,5-di-t-butyl-4-hydroxyphenyl)propionate, 2,2'-methylenebis(4-methyl-6-t-butylphenol), 4,4'-butylidene bis(3-methyl-6-t-butylphenol); phosphorus-based antioxidants such as triphenyl phosphite, diphenylalkyl phosphites, phenyldialkyl phosphites, trilauryl phosphite, trioctadecyl phosphite, distearyl pentaerythritol diphosphite, tristearyl sorbitol triphosphite; sulfur-based antioxidants such as dilauryl-3,3'-thiodipropionate and dimyristyl-3,3'-thiodipropionate.

A combination of two or more antioxidants can be used to achieve better heat resistance of the cured composition.

The content of antioxidants preferably is 0.001-0.008 wt % based on the total weight of the curable composition.

Adhesion promoters may also be added to improve the adhesion strength of the cured product on different substrates. Typical examples of adhesion promoters are methacryloxypropyltrimethoxysilane, glycidoxypropyl trimethoxysilane, allyltrimethoxy silane, vinyltrimethoxysilane, 3-mercaptopropyl trimethoxysilane and phenyl-trimethoxy silane.

The content of adhesion promoters preferably amounts 0.1-5 wt % based on the total weight of the curable composition.

A curable composition according to the invention may e.g. comprise:

| | |
|---|---|
| organopolysiloxane(s) according to the abovementioned formula (3) | 20-50 wt %, |
| organopolysiloxane(s) according to the abovementioned formula (4) | 0-30 wt % |
| methacrylate monomer(s) | 10-80 wt % |
| curing catalyst(s) | 0.01-5 wt % |
| antioxidant(s) | 0.001-0.008 wt %, |
| adhesion promoter(s) | 0.1-5 wt %, | wherein the components sum up to 100 wt % and wherein all weight percentages are based on the total weight of the composition.

The preparation of the curable composition of the present invention comprises mixing of organopolysiloxane(s) (A), curing catalyst(s) (B) and optionally of further components as mentioned hereinbefore by means of any mixing devices being commonly used in the art.

The cured product of the composition disclosed in the present invention can advantageously be applied in LED encapsulation, especially in high brightness white LEDs. The composition is preferably cured by heating it to 80-180° C., preferably 100-160° C. over a curing time of 20-300 min, preferably 30-120 min.

EXAMPLES

Example 1

The composition was prepared by mixing components as follows (all parts by weight):

70 parts of Component A-1

30 parts of Component B-1

0.4 parts of Component C

Component A-1: Methacryloxyproply-methylsiloxane-dimethylsiloxane copolymer (RMS-083) from Gelest, Inc.

Formula of Component A-1

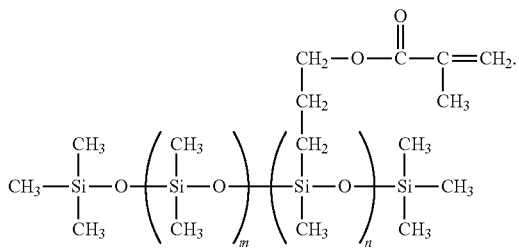

Component B-1: Isobornyl methacrylate from Sartomer.
Component C: 1,1-di-(tert-amylperoxy)cyclohexane from Arkema.

Example 2

The composition was prepared by mixing components as follows (all parts by weight):
50 parts of Component A-1
50 parts of Component B-1
0.5 part of Component C.
Component A-1, Component B-1 and Component C are the same as those components described in example 1.

Example 3

The composition was prepared by mixing components as follows (all parts by weight):
50 parts of Component A-1
10 parts of Component A-2
40 parts of Component B-1
1 part of Component C.
Component A-2: Methacryloxypropyl-methylsiloxane-dimethylsiloxane copolymer (RMS-044) from Gelest, Inc.

Formula of Component A-2

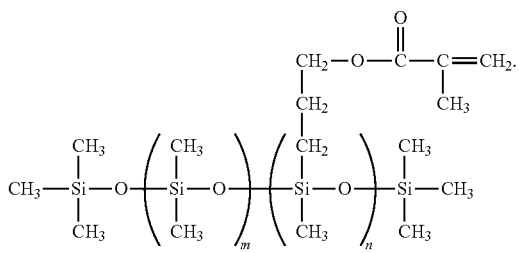

Component A-1, Component B-1 and Component C are the same as those components described in example 1.

Example 4

The composition was prepared by mixing components as follows (all parts by weight):
60 parts of Component A-1
40 parts of Component B-2
1 part of Component C.
Component B-2: Dicyclopentanyl methacrylate from TCI.
Component A-1 and component C are the same as those components described in example 1.

Comparative Example 1

The composition was prepared by mixing components as follows (all parts by weight):
100 parts of ECMS-924 (epoxy functionalized polysiloxane, Gelest)
17 parts of MHHPA (Anhydride, Shin-nihon-rika)
0.27 part of U-CAT (Amine compounds, San apro)

Effect Examples

Each composition of Examples 1-4 and comparative example 1 was molded into a sheet of 2 cm*2 cm*0.2 cm, which was then cured by heating at 150° C. for 1 hour to obtain the cured sheet with thickness of 2 mm.

Hardness Test

The hardness of the cured sheet was measured using a type A durometer (ASTM D 2240, Zwick) and type D durometer (ASTM D 2240, Zwick).

Light Transmittance Test

The light transmittance of the sheet was measured at a wavelength of 400 nm using a spectrophotometer (Evolution 600, Thermo Scientific) and the result was recorded as the initial transmittance value. Subsequently, the sample was placed in an oven at 150° C. and treated in an exposed state for 500 hours, and then the transmittance at 400 nm was measured again. For the UV aging experiment, the sample that has been measured for initial transmittance was then placed in an accelerated weathering tester (UVA-340, Q-LAB) with an irradiance of 0.89 W/m$^2$ for 500 hours; the transmittance was also measured again at 400 nm.

Crack Resistance Test

Five pieces of samples that were fabricated as above were treated in a thermal shock test by cooling to −40° C. and heating to 120° C. for 1000 cycles. The appearance of samples was inspected for cracks. If one or more of the pieces cracked the composition was evaluated as "Poor", and if no pieces cracked the composition was evaluated as "Good".

All the test results are shown in Table 1.

TABLE 1

| Property | Example 1 | Example 2 | Example 3 | Example 4 | Comparative Example 1 |
| --- | --- | --- | --- | --- | --- |
| Hardness Shore A | 80 | 97 | 87 | 90 | 65 |
| Hardness Shore D | 22 | 51 | 30 | 35 | / |
| Initial transmittance (%) | 90.2 | 90.1 | 90.0 | 90.9 | 89.8 |
| Transmittance after 500 h aging (%) | 76.5 | 83.0 | 83.2 | 80.5 | 30.1 |
| Transmittance after 500 h UV/QUV aging (%) | 90.0 | 89.5 | 89.7 | 90.4 | 90.0 |
| Crack resistance after thermal shock | Good | Good | Good | Good | Good |

As shown in table 1, the cured hybrid silicone compositions shows high hardness, good transmittance at high temperature (150° C.), excellent transmittance after UV exposure and good crack resistance after thermal shock test. On the other hand, epoxy silicone composition in comparative example 1 shows poor hardness and heat resistance.

Examples 6 and 7

(The exact amount x of each component is given in table 2.)

In a glass reactor, equipped with a vacuum unit, a metering unit and a distillation unit x g (methacryloxy)n-propyl trimethoxysilane and x g vinyl trimethoxysilane are stirred together and x g of a catalyst are added. Water x g and x g of methanol are mixed, and this mixture is added to the preceding mixture under continuous stirring within 20 minutes. The resulting mixture is stirred under reflux at 60-65° C. for additional 4 hours. Subsequently, methanol is removed from the mixture under reduced pressure (bath temperature: 60° C., pressure: 20 hPa). The resultant product is cured with peroxide at 140° C.

The crack formation within the cured compositions according to table 2 was visually evaluated by classifying the cured masses into
A—cracks visible, transparency impaired and
B—cracks negligible, transparency only marginally impaired.

The results obtained in examples 6 and 7 point up the influence of the amount of water on the transparency of the cured compositions. If less than 1 mol of water is used per 1 mol of Si-atoms present in the silanes the transparency may be impaired. Excellent transparency is achieved if more than 1.5 mol of water are used per 1 mol of Si-atoms.

TABLE 2

| Component (given in g) | Example 6 | Example 7 |
|---|---|---|
| (Trimethoxysilyl)n-propyl methacrylate | 165.6 | 165.6 |
| Vinyltrimethoxysilane | 24.68 | 24.68 |
| Ba(OH)$_2$ | 0.1 | |
| LiOH | | 0.04 |
| Water | 12.0 | 24.0 |
| Methanol | 10.68 | 10.68 |
| Crack formation | A | B |

The invention claimed is:

1. A curable composition comprising
(A) at least one organopolysiloxane represented by the composition formula (1):

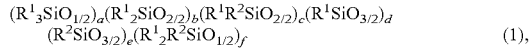
(1), wherein each $R^1$ independently represents a monovalent organic group having 1 to 20 carbon atoms or an OH group with the proviso that at each silicon-atom bearing no $R^2$ at least one $R^1$ represents a monovalent organic group having 1 to 20 carbon atoms, each $R^2$ independently represents a methacryloxyalkyl group having 5 to 20 carbon atoms and a, b, c, d, e, f each represent the fraction of the number of the respective units based on the number of all units of the organopolysiloxane and satisfy a 0, b 0, c≥0, d≥0, e≥0, f≥0 and also satisfy c+e>0 and a+b+c+d+e+f=1; and
(B) at least one curing catalyst; and
wherein the organopolysiloxane is of linear structure represented by the composition formula (3):

(3), wherein each $R^{1'}$ independently represents an unsubstituted or substituted monovalent hydrocarbon group having 1 to 20 carbon atoms, each $R^2$ independently represents a methacryloxyalkyl group having 5 to 20 carbon atoms and a, b, c each represent the fraction of the number of the respective units based on the number of all units of the organopolysiloxane and satisfy a>0, b>0, c>0 and a+b+c=1; and
wherein the composition further comprises at least one organopolysiloxane which is of branched structure represented by the composition formula (4):

(4), wherein each $R^{1'}$ independently represents an unsubstituted or substituted monovalent hydrocarbon group having 1 to 20 carbon atoms, each $R^2$ independently represents a methacryloxyalkyl group having 5 to 20 carbon atoms and a, b, c, d, e each represent the fraction of the number of the respective units based on the number of all units of the organopolysiloxane and satisfy a>0, b≥0, c≥0, d≥0, e>0 and a+b+c+d+e=1.

2. The curable composition according to claim 1, wherein the weight ratio of organopolysiloxanes represented by composition formula (3) to organopolysiloxanes represented by composition formula (4) is from 1:5 to 3:1.

3. The curable composition according to claim 1, wherein the curable composition further comprises at least one oligomeric siloxane of cyclic structure represented by the formula (5):

(5), wherein each $R^{1'}$ independently represents an unsubstituted or substituted monovalent hydrocarbon group having 1 to 20 carbon atoms, each $R^2$ independently represents a methacryloxyalkyl group having 5 to 20 carbon atoms and m and n each represent the number of the respective units, and m is an integer from 0 to 5, n is an integer from 1 to 5 and 3≤m+n≤9.

4. The curable composition according to claim 1, wherein each $R^2$ represents a methacryloxy(n-propyl) group.

5. The curable composition according to claim 1, wherein the total amount of all organopolysiloxanes is from 20 to 80 wt %, based on the total weight of the curable composition.

6. The curable composition according to claim 1, wherein the composition comprises at least one methacrylate monomer represented by formula (2):

(2), wherein z is 1, 2 or 3 and $R^3$ represents a z-valent substituted or unsubstituted hydrocarbon residue the main chain of which may comprise one or more oxygen atoms.

7. The curable composition according to claim 6, wherein the methacrylate monomer is selected from polyethylene glycol dimethacrylate, citronellyl methacrylate, hydroxypropyl methacrylate, hexanediol dimethacrylate, trimethylolpropanyl trimethacrylate, tetrahydrodicyclopentadienyl methacrylate, triethylene glycol dimethacrylate, isobornyl methacrylate, dicyclopentanyl methacrylate, cyclohexane dimethanol dimethacrylate, tricyclodecane dimethanol dimethacrylate and mixtures thereof.

8. The curable composition according to claim 6, wherein the weight ratio of the total amount of organopolysiloxanes to the total amount of methacrylate monomers is from 3:1 to 1:3.

9. The curable composition according to claim 1, wherein the curing catalyst is selected from benzyl peroxide, t-butyl perbenzoate, o-methylbenzyl peroxide, di-t-butyl peroxide, dicumyl peroxide, 1,1-bis(t-butylperoxy)-3,3,5-trimethyl cyclohexane, 1,1-di(t-butylperoxy) cyclohexane, 2,5-dimethyl-2,5-di(t-butylperoxy) hexane, 2,5-dimethyl-2,5-di(t-butylperoxy)hexane, di(4-methylbenzoylperoxy)hexamethylene biscarbonate, 1,1-di-(tert-amyl peroxy)cyclohexane and mixtures thereof.

10. A curable composition according to claim 1 as an encapsulant for LED (light emitting devices).

11. A LED (light emitting device) encapsulated by the cured product of a curable composition according to claim 1.

* * * * *